United States Patent [19]

McGehee

[11] 4,295,060

[45] Oct. 13, 1981

[54] SOLID STATE TRIGGERING CIRCUIT

[76] Inventor: Richard S. McGehee, 1509 Crawford La., Hanover Park, Ill. 60103

[21] Appl. No.: 77,347

[22] Filed: Sep. 20, 1979

[51] Int. Cl.³ .................... H03K 3/284; H03K 3/42
[52] U.S. Cl. .................................. 307/273; 307/278; 307/311
[58] Field of Search .............. 307/311, 117, 273, 278; 328/2; 324/178; 361/173, 174; 250/211 J, 214, 552

[56] References Cited
U.S. PATENT DOCUMENTS

| | | | |
|---|---|---|---|
| 3,175,152 | 3/1965 | Shafer | 307/311 |
| 4,041,331 | 8/1977 | Westerman et al. | 307/311 |
| 4,197,471 | 4/1980 | Lackey et al. | 307/311 |

Primary Examiner—Stanley D. Miller, Jr.
Assistant Examiner—B. P. Davis
Attorney, Agent, or Firm—Lester N. Arnold

[57] ABSTRACT

A solid state electronic triggering circuit is provided having a light sensitive circuit for sensing the occurrence of light interruption events, and employing a plurality of integrated circuits interconnected in a monostable switching mode, each to provide an output pulse signal for a predetermined time period determined by an RC charging circuit. An RC time delay circuit is serially connected with the monostable circuits to provide a predetermined time delay between light interruption and the output of a triggering signal from a final stage monostable circuit. An initial monostable circuit is used to register the light interruption event, and the final monostable circuit is used to provide a short duration triggering pulse suitable to trigger an SCR load gate. An additional monostable circuit is employed as an inhibitor circuit imposed on the initial monostable circuit to prevent registration of a light interruption event during any occurrence of power supply interruption.

10 Claims, 2 Drawing Figures

SOLID STATE TRIGGERING CIRCUIT

BACKGROUND OF THE INVENTION

This invention relates generally to solid state electronic triggering circuits, and more particularly, to triggering circuits responsive to light interrupting events. In the preferred embodiment this triggering circuit is used in conjunction with automatic pin-setting apparatus commonly used in the game of bowling, to sense the passing of a bowling ball and initiate the automatic pin-setting cycle.

Standard automatic pin-setting apparatus used in the game of bowling for the pick-up and resetting of bowling pins most commonly used mechanical switches and linkage to sense the impact of a bowling ball against the back wall and to initiate the pin-setting cycle. With this mechanical linkage the impact of the ball must be sufficient to close the mechanical switch to generate an electric starting signal for input to the automatic pin-setting apparatus. Frequently, failure of the switching device occurs due to fatigue and wear of the parts and resulting in mechanical failures of the switch or linkage. As a result of the failure, or of two little ball inertia, the impact often fails to be detected. These mechanical switching means are subject to increased problems of wear and insensitivity than electronic circuits. The present invention, being an electronic circuit which senses the passing ball photo electrically, is more reliable, is faster, and is less expensive to maintain than prior mechanical systems.

SUMMARY

In accordance with the present invention, an electronic triggering circuit is comprised of: light sensing circuit means for providing a first electrical signal responsive to a predetermined interruption of light exposure, RC time delay circuit means having discharging capacitor means and providing an electrical output signal following predetermined time delay from the receipt of an electrical input signal, said predetermined time delay provided by the electrical discharge of said discharging capacitor means, first monostable electronic circuit means connected to receive the first electrical signal of the light sensing circuit means and being activated thereby for providing a predetermined ON time period and further providing a first electrical output signal during the ON time period comprising the electrical input signal to the RC time delay circuit means, said first monostable circuit means including RC time constant means with charging capacitor means biasing the first monostable circuit means after a first predetermined charging time period to switch to an OFF electrical state whereby the first electrical output signal is discontinued, the first predetermined charging time period of the first monostable circuit means exceeding the discharging time period for the RC time delay circuit means, second monostable electronic circuit means connected to receive as an input signal thereto the electrical output signal from the RC time delay circuit means, said second monostable circuit means having a predetermined ON time period and providing a second electrical output signal during the ON time period, and including RC time constant means with charging capacitor means biasing the second monostable circuit means after a second predetermined charging time period to switch to an OFF electrical state whereby the second electrical output signal is discontinued, and third monostable electrical circuit means connected to receive as an input signal thereto the second electrical output signal from the second monostable circuit means, said third monostable circuit means having a predetermined ON time period and providing a third electrical output signal during the ON time period, and including RC time constant means with charging capacitor means biasing the third monostable circuit means after a third predetermined charging time period to switch to an OFF electrical state whereby the third electrical output signal is discontinued, and the second predetermined charging time period exceeding the third predetermined charging time period whereby the third monostable circuit means is disabled to provide said third electrical output signal during the continued charging time period for the second monostable circuit means, and the third electrical output signal comprising the electrical output triggering signal of the electronic triggering circuit.

The invention in accordance with its preferred embodiment further includes electronic inhibitor circuit means for inhibiting the formation of said output triggering pulse during occurrence of power supply interruptions, said inhibitor circuit means providing a fourth electrical output signal during an ON electrical state, and includes RC time constant means with charging capacitor means biasing the fourth monostable circuit means after a fourth predetermined charging time period to switch to an OFF electrical state whereby the fourth electrical output signal is discontinued, and further comprises RC filtering circuit means providing lowering of input voltage biasing to the fourth monostable circuit means upon power supply interruption for activating the ON electrical state, and the first monostable circuit means further includes a RESET electrical input signal which inhibits the ON electrical state thereof during the receipt thereof, and the fourth electrical output signal comprises the RESET electrical input signal to the first monostable circuit means.

Accordingly, it is the primary object of the present invention to provide a reliable, electronic switching and triggering circuit capable of detecting a light interrupting event such as the passing of a bowling ball, and in response thereto triggering an automatic pin-setting apparatus. It is a further object to provide a light sensitive triggering circuit which provides reliable and controllable time delays before initiating the automatic pin-setting cycle, to allow time for the bowling ball to leave the pin area and for the pins to come to rest. Other objects and advantages of the present invention will become apparent upon reading the following detailed description and upon reference to the drawings, in which:

DRAWINGS

While the present invention will be described in connection with a preferred embodiment, it will be understood that I do not intend to limit the invention to that embodiment, on the contrary I intend to cover all alternatives, modifications, and equivalents as may be included within the spirit and scope of the invention as defined by the appended claims.

DESCRIPTION OF THE PREFERRED EMBODIMENT

Figure 1:
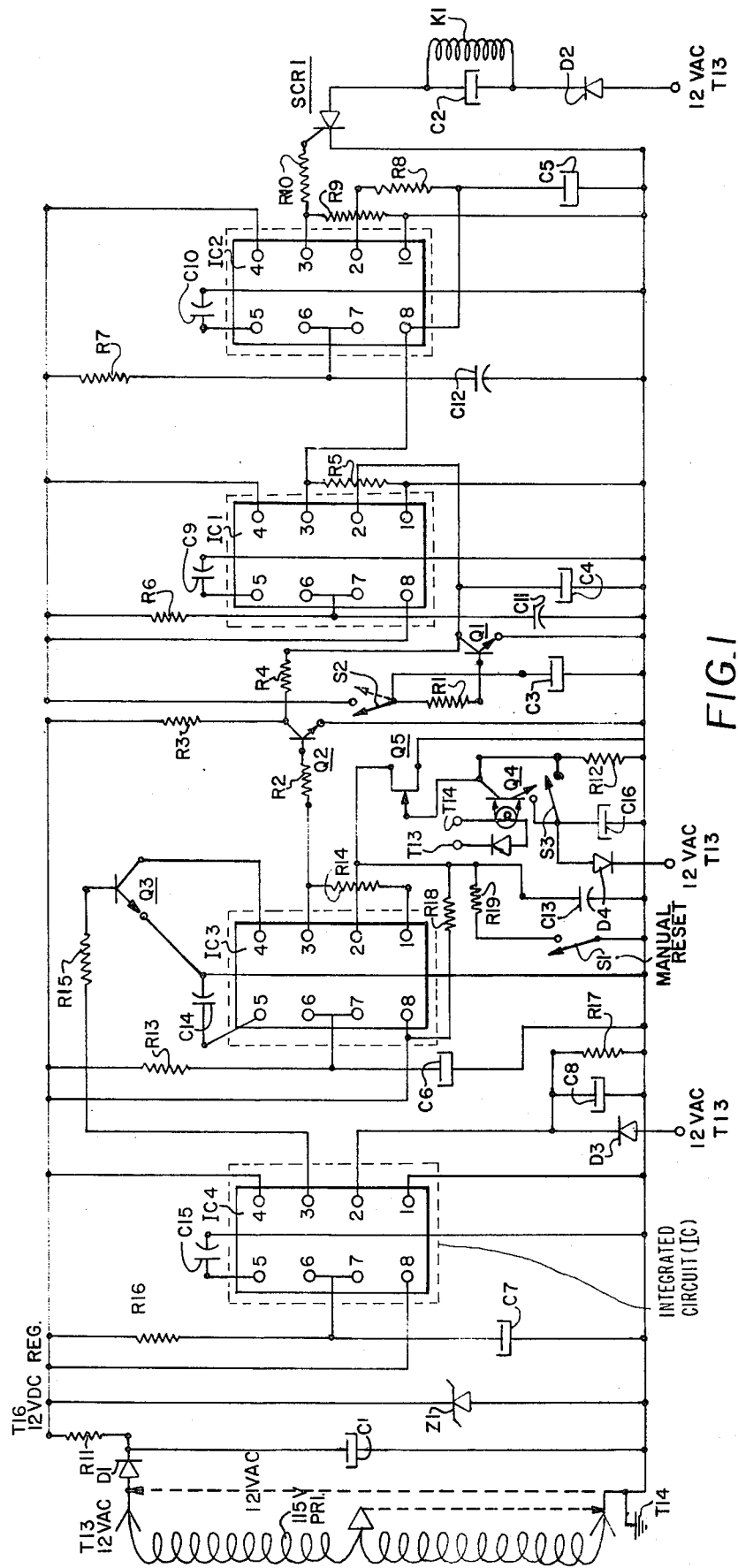
FIG. 1 is a schematic of the circuit employed in the subject invention.

Turning first to the schematic of FIG. 1, there is shown a schematic of the circuit employed in the present invention. This electronic circuit employs principally, four identical integrated circuits operated in a monostable switching mode, a light sensitive phototransistor, an RC time delay circuit having discharging capacitor means and a silicone controlled rectifier to activate a solenoid for controlling the automatic pin-setting apparatus.

Figure 2:
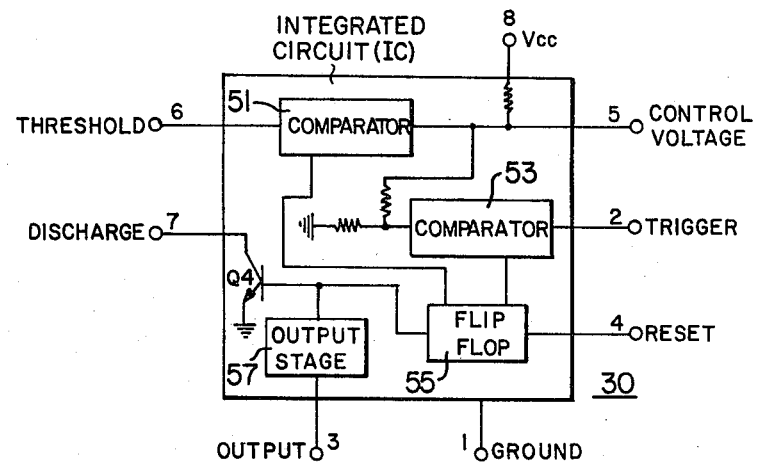
FIG. 2 is a block diagram schematic of the integrated circuit employed in the present invention.

The integrated circuits are generally connected to function in a monostable mode. Turning now to FIG. 2 there is shown a block schematic of an integrated circuit employed in the preferred embodiment of the present invention. This integrated circuit configuration may be purchased in the electronic industry and is a commonly used building block for electronic circuits. Typical devices having these characteristics are the Motorola NEV555 and the Archer Pack 276-1614 manufactured for Tandy Corporation. It is basically a highly stable monolithic timer circuit and is comprised of a pair of comparator circuits 51 and 53, a flip-flop circuit 55 and a final driver output circuit 57. The comparator circuit 51, compares the threshold input and control voltage input and supplies a signal to the flip-flop circuit to turn the output to the OFF state. The comparator circuit 53 compares the control voltage input to the trigger voltage and provides a control signal to the flip-flop circuit to turn the output to the ON state. When employed in the monostable mode, as in the present invention, the control voltage input, pin 5, is isolated from ground through a filtering capacitor. The threshold input, pin 6, is connected to ground through a capacitor and to power through a resistor. In that configuration an RC charging circuit is provided on the threshold input whereby the capacitor charges through the resistor and the voltage on pin 6 will gradually increase and turn the output OFF when the voltage at pin 6 reaches a predetermined threshold level. The integrated circuit used in this invention provides a discharge pin 7 which is pulled low at the time when the output of the circuit is switched to its ON state. By tying the discharge pin 7 to the threshold pin the capacitor charge in the RC charging circuit is lowered at the same instant the output of the integrated circuit is driven high. By pulling the capacitor charge low the charging circuit is initialized and allowed to gradually recharge to eventually turn the integrated circuit OFF.

In practice a light beam would be directed across the bowling lane towards a photo-cell transistor indicated in FIG. 2 as Q4. The circuit in the preferred embodiment is designed to give a minimum three second delay after the light beam is interrupted before activating the solenoid K1. After the time delay the solenoid receives a trigger signal through the silicone controlled rectifier SCR1 load gate to initiate the automatic pin-setting cycle.

The photo transistor Q4 is shown having a light beam normally impinging upon its photo sensitive base to forward bias its base-emitter junction. As the bowling ball interrupts the light beam, the photo-transistor Q4 is momentarily turned OFF causing the base of the FET transistor Q5 to go high. This in turn causes the trigger input, pin 2, of the integrated circuit IC3, which comprises first monostable circuit means, to drop low and the integrated circuit IC3 switches to an ON state. This switching also causes pin 7 to be pulled low, and consequently capacitor C6 begins to charge through resistor R13 with an RC time constant controlled by the combination R13 and C6. When pin 5, the threshold input to the integrated ciruit, reaches the predetermined voltage the integrated circuit IC3 is returned to its OFF state. Hence in this first stage of the subject invention the momentary light interruption event is sensed and transformed into a voltage pulse from IC3 having substantial magnitude and pulse width.

For providing the measured time delay there is provided the buffer transistor Q2 coupled to the output, pin 3, of IC3 and coupled to the trigger input of the integrated circuit IC1 which comprises second monostable circuit means through an RC time delay circuit means or network having discharging capacitor means. When the integrated circuit IC3 turns ON, as described above, a high voltage is provided at its output. This forward biases the transistor Q2 and its collector voltage drops. This in turn lowers the voltage across capacitor C4 at the input to the integrated circuit IC1 and triggers IC1 to its ON state when the voltage drops sufficiently. The voltage input to IC1 is gradually lowered while IC3 remains in its ON state, and the combination of resistor R4 and capacitor C4 determines the time constant and therefor the time delay during which IC1 will remain in its OFF state following the triggering event. When the voltage of the trigger input, pin 2, of IC1 finally falls to the predetermined triggering voltage, IC1 will switch to its ON state. The threshold input of IC1 is controlled by an RC charging circuit R6-C11 similar to that discussed R13-C6 for IC3. For the integrated circuit IC1, the resistor R6 and capacitor C11 are chosen such that the integrated circuit IC1 will be switched off at an established delay time after it is switched ON.

For delivering a defined control signal to the load solenoid coil K1 there is provided the integrated circuit IC2, which comprises third monostable circuit means, and load silicone controlled rectifier SCR2. The output of IC1 is connected directly to the power supply terminal of IC2. In this mode, when IC2 receives initial power it assumes an initial ON state. Consequently, when IC1 switches to its ON state IC2 provides, in turn, a high output to the gate of the SCR1. In this mode the use of an inverter to convert the high output of IC1 to a low trigger signal for IC2 is avoided. As IC2 switches to its ON state the voltage on the threshold input begins to rise as capacitor C12 charges through resistor R7. The RC time constant here is chosen with a short time constant to provide a momentary and well defined pulse to the SCR1 gate. The resistor R8 and capacitor C5 connect terminal 2 to ground to provide some filtering from spurious signals.

A fourth integrated circuit IC4 which comprises fourth monostable circuit means is provided to control IC3 and prevent the integrated circuit IC3 from changing state upon the temporary loss of power to the circuit or upon other unexpected voltage spikes in the power supply. As in the other integrated circuit configurations, IC4 is provided with a RC charging circuit R16-C7 on its threshold, pin 6, and discharge, pin 7. The control voltage input is isolated from ground through a filtering capacitor C15, and power supply voltage is provided on the power supply pin 8. The trigger input, however, pin 2, is provided with power supply voltage through diode D3 in parallel with the RC filtering network C8 and R17. During interruption of the power supply voltage pin 2 is drained to ground through the resistor R17. When power returns the trigger input will be low causing the output of the integrated circuit IC4 to be in its ON (high) state. As the capacitor C7 charges through R16 to a predetermined voltage at the threshold input, the integrated circuit IC4 will turn OFF. The resistor R16 and capacitor C7 determines the time constant during which the integrated circuit IC4 is allowed to be in the ON state.

IC3 is controlled when the integrated circuit IC4 is in its ON state. The switching transistor Q3 is forward biased through its base resistor R15 to thereby pull the reset input, pin 4, of IC3 low. As previously discussed pulling the reset low on this integrated circuit holds the circuit in its OFF state and prevents the output, pin 3, from switching to its ON (high) state. Hence, following a power failure, IC3 is held momentarily in its OFF state and not allowed to initiate a pinsetting function.

For providing manual control of the automatic pinsetting cycle, there is provided switches S1 and S2. Reset switch S1 connected between pin 2 of integrated circuit IC3 and ground through a resistor R18 will pull the trigger input of IC3 low when the switch is closed, and initiates the pin-setting cycle after the programmed time delay. Reset switch S2 connected between power and the base of transistor Q1 through resistor R1 will cause transistor Q1 to turn on when the switch S2 is closed. Transistor Q1, in turn, pulls down the voltage on the trigger input, pin 2, of the integrated circuit IC1 to immediately trigger the pin-setting cycle without the aforementioned time delay.

In a further aspect of the preferred embodiment of the present invention, there is provided a safety switch S3 for selectively connecting the emitter of the phototransistor Q4 to its collector. This switch is arranged to be closed by the machinery when the automatic pin-setting apparatus brings the pin rake across the lane and breaks the photocell beam. When closed, no initiating signal can be sent to the integrated circuit.

In the preferred embodiment of the present invention the following values were chosen for the components:

| Resistors | Resistance (ohms) |
| --- | --- |
| R1, R2, R12 | 100K |
| R3 | 51K |
| R4, R8 | 1M |
| R5, R9, R14 | 4.7K |
| R6, R7, R10, R15, R18 | 1K |
| R11 | 100 |
| R13, R16 | 2M |
| Capacitor | Capacitance (MF) |
| C1, C2 | 330 |
| C3 | .1 |
| C4, C6, C7 | 2.2 |
| C5 | 1 |
| C8 | 22 |
| C9-15 | .01 |
| Diodes D1, D2, and D3 | IN4001 |
| Zener Diode | IN4742 |
| Transistors | |
| Q1, Q2, Q3 | 2N2222 |
| Q4 | MRD3056 |

In summary, the triggering circuit of the present invention provides a circuit comprising light sensitive sensing means for detecting the occurrence of a light interrupting event, and a series of integrated circuits connected to operate in a monostable mode with specific timing characteristics for providing a specified time delay after the signalling event before delivering the triggering signal. More particularly, there is provided a first integrated circuit means for receiving said signal from the light sensitive means. In response it switches to its ON state, and, having an RC charging circuit of predetermined time constant arranged to turn said first integrated circuit means to its OFF state, it switches off after a defined delay. There is further provided a second integrated circuit means for receiving the output of said first integrated circuit means through an RC discharging circuit whereby said second integrated circuit switches to its ON state after a predetermined interval determined by the RC time constant of the discharging circuit. For further shaping the trigger pulse output there is provided third integrated circuit means arranged to be powered by the output of said second integrated circuit means for delivering an immediate high output trigger signal while having an RC charging circuit of relatively short time constant for turning said third integrated circuit means OFF. This quick ON-OFF switching provides a well defined triggering pulse to the gate of the silicone controlled rectifier. There is further provided a fourth integrated circuit means connected in a monostable mode and triggered from spikes or voltages loss in the power circuit and connected to inhibit the first integrated circuit means when a power failure occurs.

It is to be understood that while the present invention has been shown and described with respect to a preferred embodiment thereof, the scope thereof is not intended to be so limited and other equally suitable and equivalent modifications, configurations and changes may be made therein without departing from the spirit and scope thereof.

I claim:

1. An electronic triggering circuit comprising: light sensing circuit means for providing a first electrical signal responsive to a predetermined interruption of light exposure, RC time delay circuit means having discharging capacitor means and providing an electrical output signal following a predetermined time delay from the receipt of an electrical input signal, said predetermined time delay provided by the electrical discharge of said discharging capacitor means, first monostable electronic circuit means connected to receive the first electrical signal of the light sensing circuit means and being activated thereby for providing a predetermined ON time period and further providing a first electrical output signal during the ON time period comprising the electrical input signal to the RC time delay circuit means, said first monostable circuit means including RC time constant means with charging capacitor means biasing the first monostable circuit means after a first predetermined charging time period to switch to an OFF electrical state whereby the first electrical output signal is discontinued, the first predetermined charging time period of the first monostable circuit means exceeding the discharging time period for the RC time delay circuit means, second monostable electronic circuit means connected to receive as an input signal thereto the electrical output signal from the RC time delay circuit means, said second monostable circuit means having a predetermined ON time period and providing a second electrical output signal during the ON time period, and including RC time constant means with charging capacitor means biasing the second monostable circuit means after a second predetermined charging time period to switch to an OFF electrical state whereby the second electrical output signal is discontinued, and third monostable electrical circuit means connected to receive as an input signal thereto the second electrical output signal from the second monostable circuit means, said third monostable circuit means having a predetermined ON time period and providing a third electrical output signal during the ON time period, and including RC time constant means with charging capacitor means biasing the third monostable circuit means after a third predetermined charging time period to switch to an OFF electrical state whereby the third electrical output signal is discontinued, and the second predetermined charging time period exceeding the third predetermined charging time period whereby the third monostable circuit means is disabled to provide said third electrical output signal during the continued charging time period for the second monostable circuit means, and the third electrical output signal comprising the electrical output triggering signal of the electronic triggering circuit.

2. An electronic triggering circuit as claimed in claim 1 wherein said RC time delay means includes transistor means for biasing the electrical discharge of said discharging capacitor means.

3. An electronic triggering circuit as claimed in claim 1 wherein said first, second and third monostable electronic circuit means are comprised of highly stable monolithic integrated circuits, respectively, interconnected to operate in a monostable mode.

4. An electronic triggering circuit as claimed in claim 1 wherein the light sensing circuit means includes photo-sensitive transistor means biased to an OFF conductance state during interruption of light exposure, and further includes switching transistor means biased to an ON conductance state with non-conductance of the photo-sensitive transistor means, said switching transistor means providing said first electrical signal responsive to a predetermined interruption of light exposure.

5. An electronic triggering circuit as claimed in claim 1 wherein the second electrical output signal from the second monostable circuit means biases the input voltage of the third monostable circuit means to inhibit a second ON state thereof during the ON state of the second monostable circuit means.

6. An electronic triggering circuit as claimed in claim 1 further including electronic inhibitor circuit means for inhibiting the formation of said output triggering pulse during occurrence of power supply interruptions, said inhibitor circuit means comprises fourth monostable electronic circuit means providing a fourth electrical output signal during an ON electrical state, and includes RC time constant means with charging capacitor means biasing the fourth monostable circuit means after a fourth predetermined charging time period to switch to an OFF electrical state whereby the fourth electrical output signal is discontinued, and further comprises RC filtering circuit means providing a lowering of input voltage biasing to the fourth monostable circuit means upon power supply interruption for activating the ON electrical state, and the first monostable circuit means further includes a RESET electrical input signal which inhibits the ON electrical state thereof during the receipt thereof, and the fourth electrical output signal comprises the RESET electrical input signal to the first monostable circuit means.

7. An electronic triggering circuit comprising light sensing circuit means for sensing light interruption events and providing a first electrical signal responsive thereto, first integrated circuit means operative in a monostable switching mode and connected to receive the first electrical signal as an input signal to trigger a first monostable output signal, said monostable mode being operative for a first predetermined time period to provide the first output signal upon triggering, RC time delay circuit means having capacitor means and connected to receive the first monostable output signal, and to provide a first time delay output signal following a second predetermined time period, said first predetermined time period exceeding the second predetermined time period, second integrated circuit means operative in a monostable switching mode and connected to receive the first time delay output signal as an input signal to trigger a second monostable output signal, said monostable mode being operative for a third predetermined time period to provide the second output signal upon triggering, third integrated circuit means operative in a monostable switching mode and connected to receive the second monostable output signal for triggering a third monostable output signal, said monostable mode being operative for a fourth predetermined time period to provide the third output signal upon triggering, the third predetermined time period exceeding the fourth predetermined time period, and the third monostable output signal comprising the electrical output triggering signal of the electronic triggering circuit.

8. An electronic triggering circuit as claimed in claim 7 wherein the second monostable output signal received by the third integrated circuit means in operative to inhibit the triggering of the third monostable output signal for the time period during which the third predetermined time period exceeds the fourth predetermined time period.

9. An electronic triggering circuit as claimed in claim 7 further including integrated inhibitor circuit means for inhibiting the third monostable output triggering signal during occurrence of power supply interruptions.

10. An electronic triggering circuit as claimed in claim 9 wherein the integrated inhibitor circuit means is operative in a monostable switching mode and is biased by a power supply interruption to trigger a fourth monostable output signal, therefrom said fourth monostable output signal is coupled to the first integrated circuit means for inhibiting the triggering of the first monostable output signal during power supply interruptions.

* * * * *